(12) United States Patent
Chauvet

(10) Patent No.: US 6,194,810 B1
(45) Date of Patent: Feb. 27, 2001

(54) PIEZOELECTRIC OR SIMILAR TRANSDUCER DEVICE WITH AN OSCILLATING CIRCUIT EXCITABLE BY A CONTROL CIRCUIT

(75) Inventor: Francis Chauvet, Moutiers (FR)

(73) Assignee: Schneider Electric Industries SA, Rueil-Malmaison (FR)

( * ) Notice: Subject to any disclaimer, the term of this patent is extended or adjusted under 35 U.S.C. 154(b) by 0 days.

(21) Appl. No.: 09/495,316

(22) Filed: Feb. 1, 2000

(30) Foreign Application Priority Data

Feb. 2, 1999 (FR) .................................................. 99 01206

(51) Int. Cl.[7] .................................................. H01L 41/09
(52) U.S. Cl. .......................................................... 310/317
(58) Field of Search .............................. 310/316.01, 318, 310/319, 316.02, 317

(56) References Cited

U.S. PATENT DOCUMENTS

| | | | |
|---|---|---|---|
| 4,914,336 | * 4/1990 | Yamasaki | 310/316.01 |
| 5,010,222 | * 4/1991 | Suganuma | 310/316.02 |
| 5,355,047 | * 10/1994 | Okada | 310/316.01 |

FOREIGN PATENT DOCUMENTS

| | | | |
|---|---|---|---|
| 0 012 653 | 6/1980 | (EP) | H03K/3/35 |
| 0 283 254 | 9/1988 | (EP) | H02M/3/337 |
| 2 559 331 | 8/1985 | (FR) | H04N/9/44 |

OTHER PUBLICATIONS

Patent Abstracts of Japan, JP 7-093668, Apr. 7, 1995.
Patent Abstracts of Japan, JP 10-284941, Oct. 23, 1998.
Patent Abstracts of Japan, JP 4-277809, Oct. 2, 1992.

* cited by examiner

*Primary Examiner*—Thomas M. Dougherty
(74) *Attorney, Agent, or Firm*—Oblon, Spivak, McClelland, Maier & Neustadt, P.C.

(57) ABSTRACT

The control circuit 12 generates an alternating voltage Ve through a flip-flop 13, preferably with inverter switches laid out in H form, in order to excite the oscillating circuit 11. The voltage Ve is made synchronous with the current i that passes through the transducer by means of a phasing device 14 that comprises 2 transistors T1, T2 coupled through their basis to an output 13b from the flip-flop and through their emitters to a terminal of the oscillating circuit. The link of the transducer with its control circuit is made using two wires only.

7 Claims, 3 Drawing Sheets

PIEZOELECTRIC OR SIMILAR TRANSDUCER DEVICE WITH AN OSCILLATING CIRCUIT EXCITABLE BY A CONTROL CIRCUIT

BACKGROUND OF THE INVENTION

1. Field of the Invention

This invention relates to a piezoelectric or similar transducer device with an oscillating circuit excitable by a control circuit, the said control circuit having an alternating voltage generator that outputs an alternating excitation voltage to the oscillating circuit terminals with a frequency determined such that an alternating sinusoidal operating current with the same frequency passes through the oscillating circuit.

2. Discussion of the Background

In known piezoelectric transducer devices of this type, the excitation frequency is different from the resonant voltage in the oscillating circuit; the result is that the current passing through the oscillating circuit is not in phase with the excitation voltage, such that the transducer is not used under its maximum efficiency conditions. Since the resonant frequency of a piezoelectric transducer can vary fairly significantly, for example by plus or minus 15%, it would be impossible to consider exciting it using an oscillator with a fixed frequency.

Furthermore, in known transducer devices, the transducer device itself is connected to the control circuit through two wires when a return signal is not required. It is connected to it through three wires when a return signal is required.

SUMMARY OF THE INVENTION

The purpose of the invention is to simply optimize the energy efficiency of a piezoelectric or similar transducer device of the type described above. It is also designed to enable this type of optimization using two connecting wires only between the transducer device and its control circuit.

According to the invention, the alternating voltage generator is a flip-flop to which control means are coupled such that the flip-flop changes state when the operating current changes sign.

The control means preferably comprise a device for putting the alternating excitation in phase with the operating current, this device being connected to the oscillation circuit and to an input of the flip-flop to output a control signal to the flip-flop that switches when the operating current changes sign in order to adjust the excitation frequency to the resonant frequency of the oscillating circuit. The link between the oscillating circuit and the control circuit is advantageously made using two wires only and a resistor to adjust the transducer emission level may be located on one of these wires.

In one very simple embodiment, the control means comprise at least one pair of power transistors inserted between the flip-flop and the oscillating circuit as follows: their base-emitter paths are capable of connecting one output from the flip-flop to a terminal of the oscillating circuit and their collectors are connected to one input of the flip-flop through diodes with inverse polarities; in this way, the transistor base current is approximately equal to the operating current and the collector current generates periodic pulses forming the flip-flop control signal.

The flip-flop preferably comprises inverter switches mounted according to an H type structure top-to-bottom with respect to the oscillating circuit and it may be laid out to form a starter oscillator.

A non-limitative embodiment will now be described with reference to the attached drawings.

DESCRIPTION OF THE PREFERRED EMBODIMENTS

Figure 1:
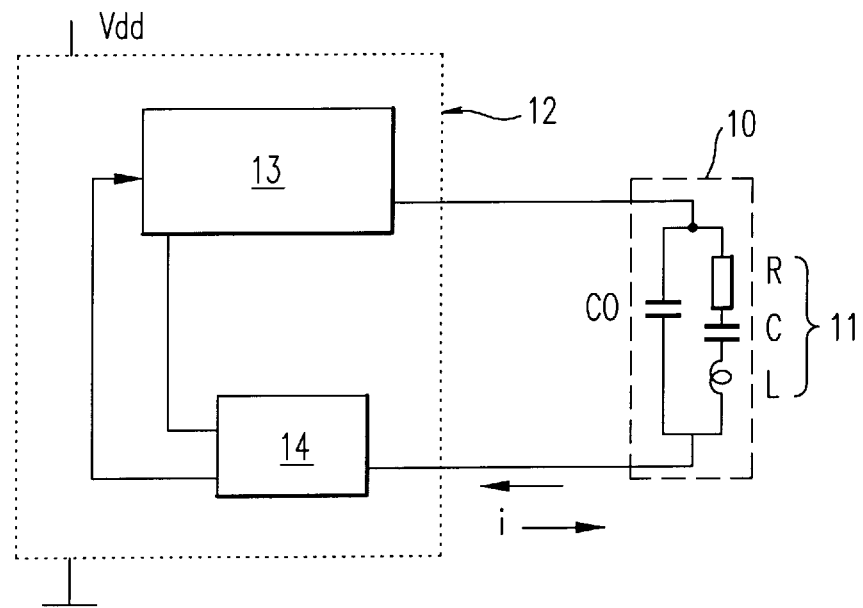
FIG. 1 is a block diagram of a piezoelectric transducer device according to the invention.

The transducer device illustrated in the figures is of the piezoelectric type provided with a transducer device 10 itself with a serial oscillating circuit 11 and the control circuit 12. The transducer device may be used in a buzzer and the serial oscillating circuit 11 can be considered like an assembly formed by an RLC serial circuit and an intrinsic capacitor C0 in parallel with this serial circuit.

The control circuit 12 comprises an alternating voltage generator 13 that outputs an alternating excitation voltage Ve with a determined frequency F to the oscillating circuit 11, such that a sinusoidal alternating operational current i of the same current passes through the oscillating circuit. The oscillating circuit 11 has a resonant frequency F0.

The voltage generator 13 is preferably, and conventionally, an H type structure operating in double push-pull to generate a useful alternating voltage Ve at the oscillating circuit terminals equal to twice the power supply voltage Vdd. The H structure is laid out as a flip-flop with a loop resistor R1, one output 13a of which is connected to the oscillating circuit 11.

The control circuit 12 comprises secondly a device 14 for putting the alternating excitation voltage Ve into phase with the operating current i, acting as control means associated with the flip-flop, such that the fronts of Ve coincide with when the current i passes through zero. The result of this layout is that the excitation frequency F of Ve is equal to the resonant frequency F0 of the oscillating circuit.

Device 14 has one input 14a connected to a terminal 11b of the oscillating circuit 11, another input 14b connected to an output 13b from the flip-flop 13 and an output 14c connected to an input 13c of flip-flop 13.

The output 13a of flip-flop 13 is connected to another terminal 11a of the oscillating circuit 11. Note that according to one interesting characteristic of the device, there are two terminals 11a, 11b in the oscillator circuit 11 and they are connected by only two wires 15, 16 to terminals 13a, 14a in the control circuit 12.

Figure 2:
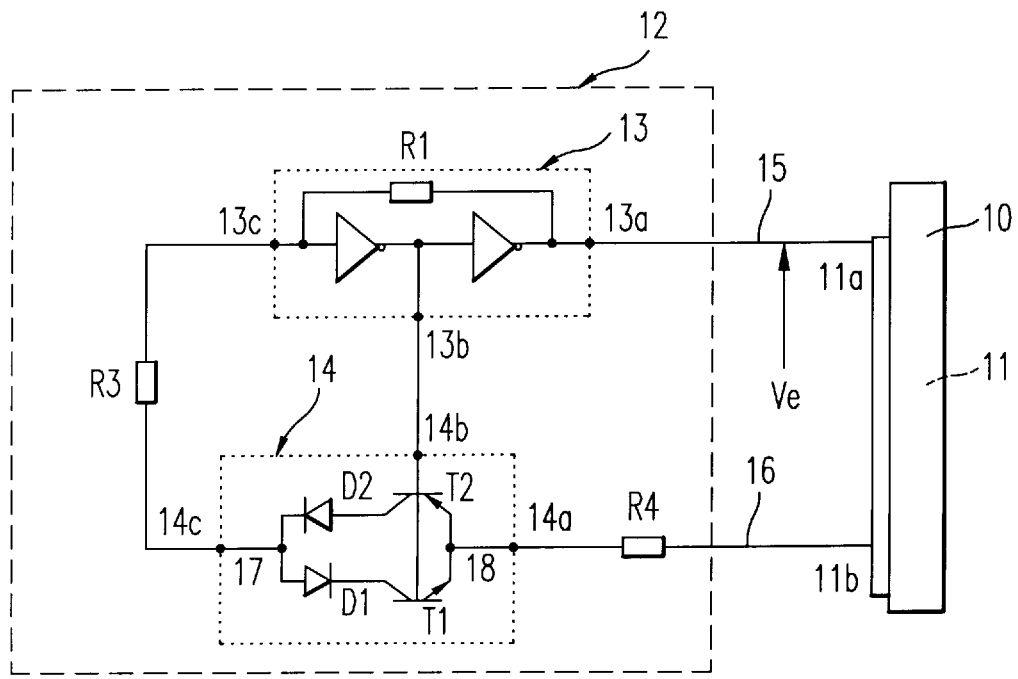
FIG. 2 illustrates a preferred embodiment.

As can be seen in FIG. 2, the phase control device 14 preferably comprises a pair of inverse npn and pnp transistors T1, T2, the emitters of which are jointly connected through a common point 18 to a terminal 11b of the oscillating circuit through a gain adjustment resistor R4. The collectors of transistors T1, T2 are connected to a common point 17 through diodes D1, D2 with inverse polarity and the common point 17 is connected to the input 13c of flip-flop 13 through a resistor R3. The bases of transistors T1, T2 are jointly connected to the output 13b of the flip-flop. Therefore, the flip-flop 13 is connected to a terminal 11b of the oscillating circuit through the base-emitter path of the transistors, whereas the transistor collector is looped onto the flip-flop input.

Figure 8:
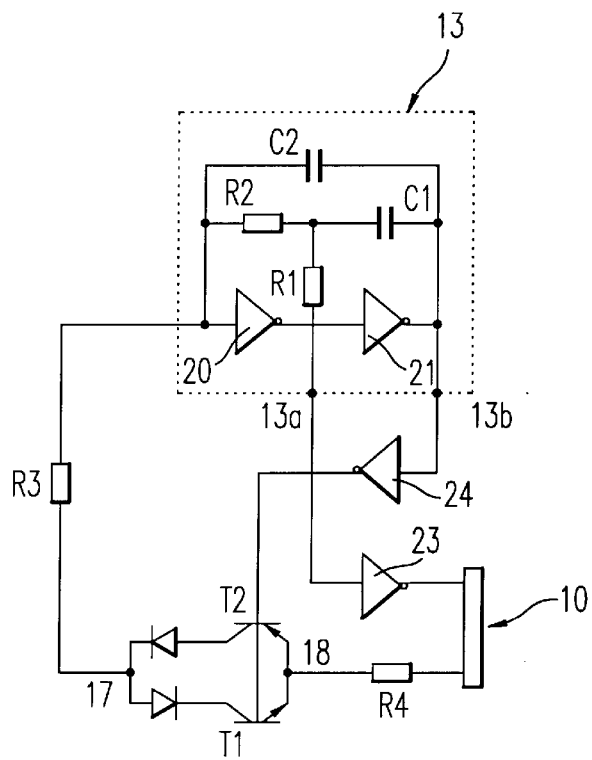
FIG. 8 illustrates the use of a starter oscillator.

In the embodiment shown in FIG. 8, the flip-flop 13 also comprises a starter oscillator. It comprises two cmos inverter buffers 20, 21, the mid-point E of which is located between the output from 20 and the input to 21, it is connected through an inverter buffer 23 to the transducer device 10. The output 13b from inverter 20 is connected through an inverter buffer 24 to the bases of transistors T1, T2. The roles of the inverter switches 23, 24 are isolation and amplification. Point E is also connected through a resistor R1 to an intermediate point between a resistor R2 and a capacitor C1; the elements R2, C1 are mounted in parallel to inverter switches 20, 21, and the situation is the same for capacitor C2. Initially, flip-flop 13 oscillates at a frequency slightly below the oscillating circuit resonant frequency F0, and then increases to frequency F0 during operation.

The R1, C1 elements define the frequency of the starter oscillator, whereas C2 increases its changeover speed. The resistor R3 placed between point 17 and the flip-flop-oscillator 13 limits the capacitive effect of base-collector junctions of transistors T1, T2. The resistor R4 placed between the transducer device 10 and the common point 18 of the emitters of transistors T1, T2 is used to adjust the transducer sound volume. The sound volume can also be adjusted by modifying the power supply voltage Vdd. Obviously, several inverter switches can be put in parallel to control the oscillating circuit 11.

The operation of the transducer according to the invention will now be described with reference to FIGS. 3 to 7.

Figure 3:
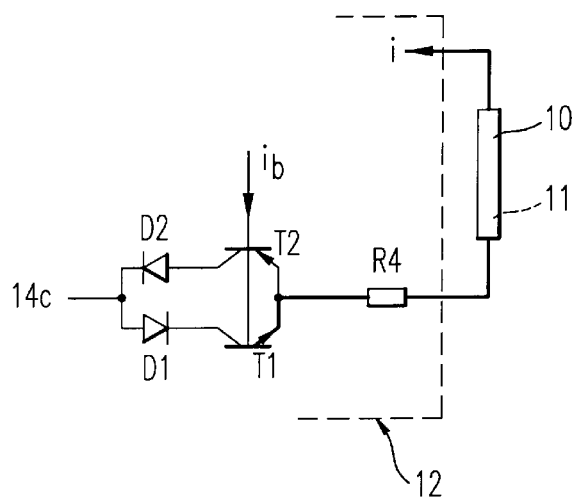
FIGS. 3 to 6 show several operating phases of the control circuit.
Figure 4:
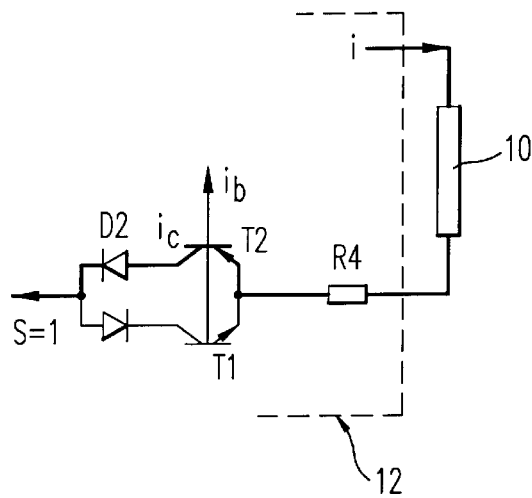
Figure 5:
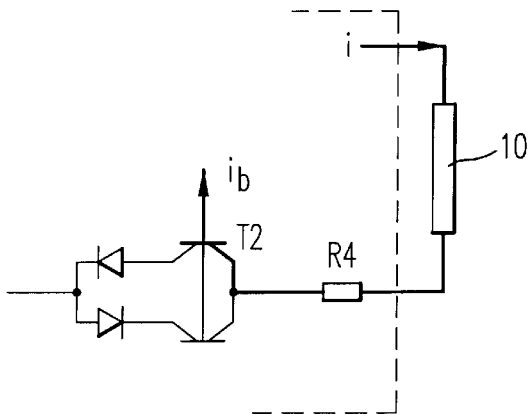
Figure 6:
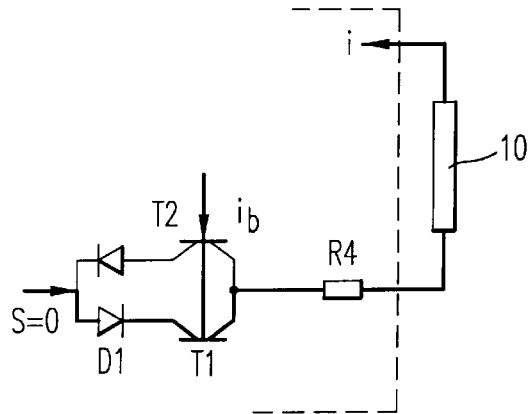
Figure 7:
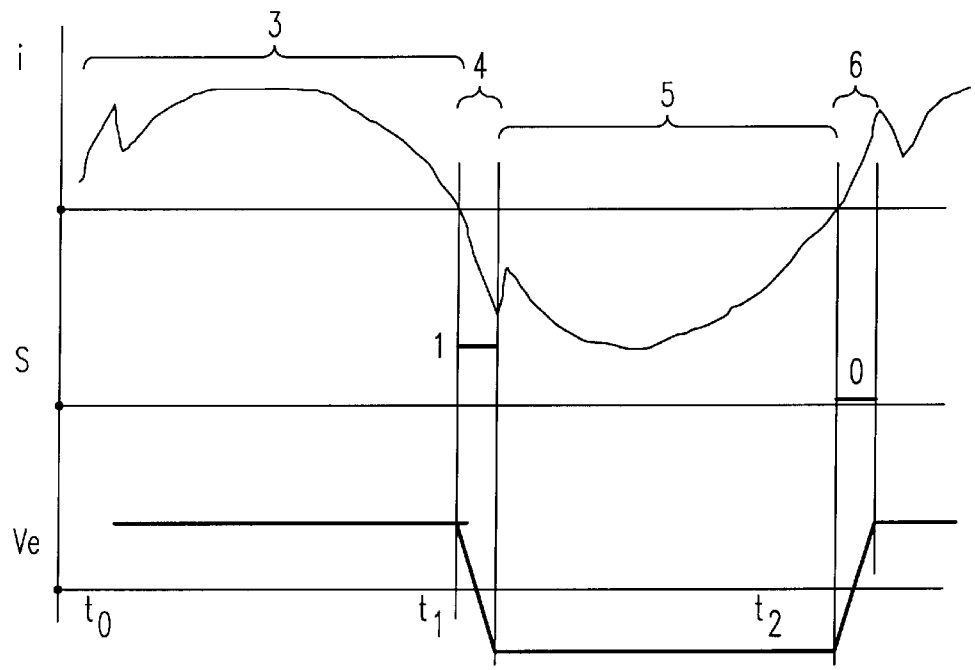
FIG. 7 illustrates the variation of different magnitudes specific to the control circuit.

At time $t_0$, the current i passes through the oscillating circuit in the direction shown in FIG. 3, which will be considered as the positive current; since the output from the phasing device 14 is connected to a load with a relatively high impedance, the collector current in transistor T2 is low compared with the T2 base current Ib and therefore current i is approximately equal to Ib; transistor T1 is blocked.

The signal S available at the output 14c from device 14 is then in an undetermined state, and therefore the excitation voltage Ve of the oscillating circuit 11 is positive and its sign is the same as the sign of the current i.

At time $t_i$ (see FIG. 4), the current i passes through zero and changes sign, and the result is a collector current Ic that causes an output signal S in the high state (1); therefore the flip-flop 13 outputs a voltage Ve that becomes negative synchronously with the current i.

Until time $t_2$ (see FIG. 5), the state of the signal S is undetermined and the voltage Ve remains negative. At time $t_2$ (see FIG. 6) the current i passes through zero to become positive and the signal S changes to the low state (0); the flip-flop 13 outputs a voltage Ve that becomes positive synchronously with the current i.

What is claimed is:

1. A transducer device having an oscillating circuit and a control circuit configured to excite the oscillating circuit, said control circuit having an alternating voltage generator that outputs an alternating excitation voltage (Ve) with a frequency (F) to the oscillating circuit, the frequency being determined such that an approximately sinusoidal alternating operating current (i) with the frequency (F) passes through the oscillating circuit, wherein the alternating voltage generator is a flip-flop coupled to control means such that the flip-flop changes state when the operating current (i) changes polarity.

2. Device according to claim 1, wherein the control means comprises a phasing device configured to put the alternating excitation voltage (Ve) into phase with the alternating operating current (i) and which is connected to the oscillating circuit and to an input to the flip-flop to output a control signal (S) to this input that switches when the operating current changes polarity, in order to adjust the excitation frequency (F) to the level of the resonant frequency (FO) of the oscillating circuit.

3. Device according to claim 2, wherein the phasing device comprises at least one pair of power transistors, the bases of said power transistors being connected to an output of the flip-flop, the emitters of said power transistors being connected to the oscillating circuit and the collectors of said power transistors being connected to an input of the flip-flop through a respective diode mounted inversely, such that the base current of the transistors approximately forms the operating current (i) and the collector current of the transistors generates periodic pulses at the input to the flip-flop, to form the control signal (S) for the flip-flop.

4. Device according to claim 1, wherein the flip-flop is laid out to form an H structure which comprises inverter switches mounted top-to-bottom with respect to the oscillating circuit.

5. Device according to claim 1, wherein the oscillating circuit is connected to the control circuit through two wires.

6. Device according to claim 1, wherein the flip-flop is laid out to form a starter oscillator.

7. Device according to claim 1, wherein a transducer emission level adjustment resistor is placed on a wire connecting the transducer device to the control means.

* * * * *